United States Patent
Park et al.

(10) Patent No.: US 12,342,570 B2
(45) Date of Patent: Jun. 24, 2025

(54) METHOD FOR MANUFACTURING SEMICONDUCTOR DEVICE AND SEMICONDUCTOR DEVICE MANUFACTURED THEREBY

(71) Applicants: HYUNDAI MOTOR COMPANY, Seoul (KR); KIA CORPORATION, Seoul (KR)

(72) Inventors: Junghee Park, Suwon-si (KR); Dae Hwan Chun, Suwon-si (KR); Jungyeop Hong, Seoul (KR); Youngkyun Jung, Seoul (KR); Nackyong Joo, Suwon-si (KR)

(73) Assignees: HYUNDAI MOTOR COMPANY, Seoul (KR); KIA CORPORATION, Seoul (KR)

( * ) Notice: Subject to any disclaimer, the term of this patent is extended or adjusted under 35 U.S.C. 154(b) by 523 days.

(21) Appl. No.: 17/748,016

(22) Filed: May 18, 2022

(65) Prior Publication Data
US 2023/0207683 A1 Jun. 29, 2023

(30) Foreign Application Priority Data
Dec. 27, 2021 (KR) .......... 10-2021-0188457

(51) Int. Cl.
| | |
|---|---|
| H01L 21/04 | (2006.01) |
| H01L 21/265 | (2006.01) |
| H01L 21/266 | (2006.01) |
| H10D 30/01 | (2025.01) |
| H10D 30/66 | (2025.01) |

(52) U.S. Cl.
CPC ..... *H10D 30/668* (2025.01); *H01L 21/26586* (2013.01); *H01L 21/266* (2013.01); *H10D 30/0297* (2025.01)

(58) Field of Classification Search
CPC ............ H01L 21/047; H01L 21/26586; H01L 29/66734; H01L 29/7813; H10D 30/0297; H10D 30/668
See application file for complete search history.

(56) References Cited

U.S. PATENT DOCUMENTS

| | | | |
|---|---|---|---|
| 6,211,006 B1 | 4/2001 | Tsai et al. | |
| 2008/0003748 A1* | 1/2008 | Cho ................ | H01L 29/66621 257/E21.429 |
| 2012/0205772 A1* | 8/2012 | Chen ................ | H01L 29/8725 438/570 |
| 2021/0384346 A1* | 12/2021 | Hsieh ................ | H01L 29/0634 |
| 2022/0367636 A1* | 11/2022 | Hsieh ................ | H01L 29/0623 |

FOREIGN PATENT DOCUMENTS

| | | | | |
|---|---|---|---|---|
| CN | 209981225 U | * | 1/2020 | .......... H01L 29/402 |
| KR | 10-2020-0059053 A | | 5/2020 | |

* cited by examiner

*Primary Examiner* — Michele Fan
(74) *Attorney, Agent, or Firm* — MCDONNELL BOEHNEN HULBERT & BERGHOFF LLP

(57) ABSTRACT

A method for manufacturing a semiconductor device includes forming an N-type layer on the first surface of the N+ type substrate, etching the N-type layer to form a trench, forming a sacrificial layer on an inner bottom surface of the trench, forming a first mask on an inner side of the trench, removing the sacrificial layer, and forming a P type shield region by implanting ions into an inner surface of the trench exposed by the removal of the sacrificial layer.

15 Claims, 15 Drawing Sheets

METHOD FOR MANUFACTURING SEMICONDUCTOR DEVICE AND SEMICONDUCTOR DEVICE MANUFACTURED THEREBY

CROSS-REFERENCE TO RELATED APPLICATION

This application claims priority to and the benefit of Korean Patent Application No. 10-2021-0188457 filed in the Korean Intellectual Property Office on Dec. 27, 2021, the entire contents of which are incorporated herein by reference.

BACKGROUND

(a) Field

The present disclosure relates to a method for manufacturing a semiconductor device including a trench gate and a P type shield region, and to a semiconductor device manufactured thereby.

(b) Description of the Related Art

Semiconductor devices (MOSFETS, JFETs, MESFETs, IGBTs, etc.) are three-terminal devices capable of conducting current through a control of the gate terminal. In particular, power semiconductor transistors for switching require high voltage and large current. Silicon carbide (SiC)-based electric power semiconductor devices exhibit higher voltage and larger current characteristics than Si devices and thus are being actively researched and commercialized.

The semiconductor devices have different electrical characteristics depending on their structure and are appropriately used depending on an application field. However, the semiconductor devices commonly require high current density, a low turn-on voltage, a high breakdown voltage, a low leakage current, and a fast switch speed, and in order to simultaneously satisfy these requirements, various structures have been proposed. However, since these above electrical characteristics have trade-off relationship one another, studies on weakening the trade-off relationship to provide structures for improving at least one characteristic as well as maintaining the other characteristics are being continuously made.

In particular, as for SiC trench MOSFET, since an oxide film is destroyed by a strong electric field formed in a gate oxide film and thereby reduces a breakdown voltage, structures for protecting the oxide film are required. As one of the structures for protecting the gate oxide film of the trench MOSFET, a P type shield structure of forming a P type region at the bottom of a trench gate is used.

In the P type shield structure, in order to weaken the electric field at edges (corners) of the trench, which is a region where the electric field is most strongly applied, a P type shield shape covering the edges of the trench is required. However, since SiC is not well diffused in a horizontal direction, the P type shield covering the edges of the trench is difficult to form.

SUMMARY

An embodiment provides a semiconductor device that protects an oxide film at the edge portion of the trench gate, and thus may prevent the oxide film from being destroyed and a breakdown voltage from being reduced due to a concentration of an electric field on the oxide film at the edge portion of the trench gate, and may prevent a current being reduced due to ion implantation to protect the edge portion of the trench gate, in particular, in a SiC-based semiconductor device.

Another embodiment provides a method for manufacturing a semiconductor device that effectively manufactures a P type shield region covering the edge portion of the trench gate in a SiC-based semiconductor device in which horizontal diffusion of ions does not occur well, and that does not require a development of a new process technology because a conventional ion implantation process and an epitaxial process are used.

According to an embodiment, a method for manufacturing a semiconductor device includes forming an N-type layer on the first surface of the N+ type substrate, etching the N-type layer to form a trench, forming a sacrificial layer on an inner bottom surface of the trench, forming a first mask on an inner side of the trench, removing the sacrificial layer, and implanting ions into an inner surface of the trench exposed by the removal of the sacrificial layer to form a P type shield region.

The forming of the trench may include forming a second mask having an opening having a first width on the N-type layer and then etching the N-type layer to a partial depth using the second mask to form the trench.

The method for manufacturing the semiconductor device may further include forming a P type region in the N-type layer.

The forming of the trench may include etching the P type region and the N-type layer to form the trench.

The sacrificial layer may fill an interior of the trench from the inner bottom surface of the trench to a partial height of the inner side of the trench. The sacrificial layer may have a height of greater than or equal to about 10 nm.

An upper surface of the sacrificial layer may be disposed under an interface between the P type region and the N-type layer.

A height of a channel may be adjusted by adjusting a distance between the upper surface of the sacrificial layer and the interface between the P type region and the N-type layer.

The forming of the first mask may include forming the first mask on the inner side of the trench and the upper surface of the sacrificial layer, and removing the first mask on the upper surface of the sacrificial layer to expose the sacrificial layer.

The removing of the first mask on the upper surface of the sacrificial layer may use a dry etching method.

The removing of the sacrificial layer may use a wet etching method including phosphoric acid ($H_3PO_3$).

An etch-rate ratio of the first mask and the sacrificial layer may be greater than or equal to about 1:1.5.

The sacrificial layer may include $N_xSi_y$ (x, y≥2).

The first mask may include $SiO_2$.

The forming of the P type shield region may use a tilt ion implantation and a vertical ion implantation method.

The method for manufacturing the semiconductor device may further include forming a first insulating layer on the inner bottom surface and side surface of the trench and on the P type region.

The method for manufacturing the semiconductor device may further include forming a second insulating layer on the gate electrode after forming the gate electrode inside the trench.

The method for manufacturing the semiconductor device may further include forming an N+ type region in the P type region and on a side surface of the trench.

The method for manufacturing the semiconductor device may further include forming a source electrode on the N-type layer to be insulated from the gate electrode.

The method for manufacturing the semiconductor device may further include forming a drain electrode on a second surface of the substrate.

According to another embodiment, a semiconductor device includes an N+ type substrate, an N-type layer disposed on a first surface of the N+ type substrate, the N-type layer having a trench opening to a side opposite to the side facing the N+ type substrate, a gate electrode inside the trench, and a source electrode and a drain electrode insulated from the gate electrode, wherein the N-type layer includes a P type shield region covering a bottom surface and an edge of the trench.

The P type shield region may extend to a partial height on the sides of the trench.

The method for manufacturing the semiconductor device according to another embodiment may effectively manufacture a P type shield region covering the edge portion of a trench gate in a SiC-based semiconductor device in which horizontal diffusion of ions does not occur well.

The semiconductor device according to another embodiment may protect an oxide film of the edge portion of the trench gate, and prevent destruction of the oxide film of the edge portion of the trench gate and reduction of a breakdown voltage due to a concentration of an electric field on the oxide film at the edge portion of the trench gate, and may prevent a current being reduced due to ion implantation to protect the edge portion of the trench gate, in particular, in a SiC-based semiconductor device.

DETAILED DESCRIPTION

Figure 1:
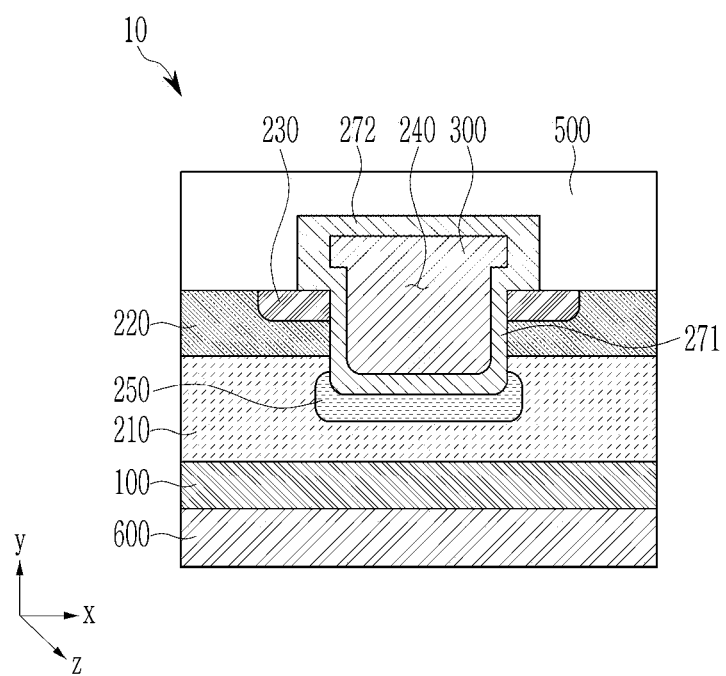
FIG. 1 is a view illustrating a cross-section of a semiconductor device manufactured by a method for manufacturing a semiconductor device according to an embodiment.

The advantages and features of the present disclosure and the methods for accomplishing the same will be apparent from the embodiments described hereinafter with reference to the accompanying drawings. However, the embodiments should not be construed as being limited to the embodiments set forth herein. Unless otherwise defined, all terms (including technical and scientific terms) used herein have the same meaning as commonly understood by one of ordinary skill in the art. The terms defined in a generally-used dictionary may not be interpreted ideally or exaggeratedly unless clearly defined. In addition, unless explicitly described to the contrary, the word "comprise," and variations such as "comprises" or "comprising," will be understood to imply the inclusion of stated elements but not the exclusion of any other elements.

Further, the singular includes the plural unless mentioned otherwise.

In the drawings, the thickness of layers, films, panels, regions, etc., are exaggerated for clarity. Like reference numerals designate like elements throughout the specification.

It will be understood that when an element such as a layer, film, region, or substrate is referred to as being "on" another element, it can be directly on the other element or intervening elements may also be present. In contrast, when an element is referred to as being "directly on" another element, there are no intervening elements present.

FIG. 1 is a view illustrating a cross-section of a semiconductor device 10 according to an embodiment. FIG. 1 is a cross-sectional view taken in a direction substantially perpendicular to a direction in which the gate electrode 300 extends.

For example, a direction in which the gate electrode 300 extends may be a Z direction, and a direction substantially perpendicular to the Z direction may be an X direction and a Y direction. Hereinafter, in the present specification, the X direction may be referred to as a width direction, the Y direction may be referred to as a height direction, and a direction opposite to the Y direction may be referred to as a depth direction. Also, in this specification, the Y direction may be referred to as an upper direction, and a direction opposite to the Y direction may be referred to as a lower direction.

A semiconductor device 10 includes an N+ type substrate 100, an N-type layer 210, a P type region 220, a gate electrode 300, a source electrode 500, and a drain electrode 600.

For example, the N+ type substrate 100 may be an N+ type silicon carbide (SiC) substrate. The N-type layer 210 is disposed on a first surface of the N+ type substrate 100. The N-type layer 210 may be formed by epitaxial growth or implantation of N-type ions.

The N-type layer 210 includes a trench 240. The trench 240 is opened toward an opposite side to the side where the N-type layer 210 faces the N+ type substrate 100. In other words, the trench 240 is opened to the Y direction in FIG. 1. An inner surface of the trench 240 generally horizontal with the surface of the N-type layer 210 and having as deep a step difference as a predetermined depth in the Y direction may be defined as an inner bottom surface of the trench 240, an inner surface of the trench 240 connecting the surface of the N-type layer 210 and the inner bottom surface of the trench 240 and extended in the Y direction may be defined as an inner side of the trench 240, and a line where the inner bottom surface of the trench 240 meets the inner side of the trench 24 may be defined as an inner edge (corner) of the trench 240.

The P type region 220 is disposed in the N-type layer 210 and at the side of the trench 240. For example, the P type region 220 may be disposed on the upper direction (Y direction) surface of the N-type layer 210. The P type region 220 is a region where P type ions are implanted into the N-type layer 210.

Optionally, an N+ type region 230 may be disposed in the P type region 220 and at the side of the trench 240. For example, the N+ type region 230 may be disposed on the upper direction (Y direction) surface of the P type region 220. Accordingly, the N-type layer 210, the P type region 220, and the N+ type region 230 may be sequentially disposed in the upper direction (Y direction) at the side of the trench 240. The ions may be implanted at a higher concentration into the N+ type region 230 than into the N-type layer 210.

A first insulating layer 271 may be disposed inside the trench 240, and on the first insulating layer 271, the gate electrode 300 is disposed. In other words, the first insulating layer 271 is disposed between the trench 240 and the gate electrode 300.

The gate electrode 300 may include a first gate electrode region filling the trench 240 and a second gate electrode region protruding outside the trench.

On the second gate electrode region protruding outside the trench 240, a second insulating layer 272 is disposed. Optionally, the second insulating layer 272 may be disposed on the N+ type region 230, on the P type region 220, or on the N-type layer 210.

The gate electrode 300 may include polysilicon or a metal. The first insulating layer 271 or the second insulating layer 272 may include $SiO_2$, $Si_3N_4$, or a combination thereof.

On the N-type layer 210, the source electrode 500 is disposed. The source electrode 500 may be disposed on the P type region 220, the N+ type region 230, and/or the N-type layer 210. The source electrode 500 may be insulated from the gate electrode 300 by the second insulating layer 272. The source electrode 500 may include Cr, Pt, Pd, Au, Ni, Ag, Cu, Al, Mo, In, Ti, polycrystalline Si, oxides thereof, nitrides thereof, or alloys thereof. In addition, the source electrode 500 may include a multi-layer electrode structure of stacked different metal layers, for example, Pt/Au, Pt/Al, Pd/Au, Pd/Al, or Pt/Ti/Au and Pd/Ti/Au.

The drain electrode 600 is disposed on a second surface of the N+ type substrate 100. Optionally, the drain electrode 600 may also be disposed on the N-type layer 210. The drain electrode 600 may include Cr, Pt, Pd, Au, Ni, Ag, Cu, Al, Mo, In, Ti, polycrystalline Si, oxides thereof, nitrides thereof, or alloys thereof. In addition, the drain electrode 600 may include a multi-layer electrode structure of stacked different metal layers, for example, Ti/Au or Ti/Al.

On the other hand, the N-type layer 210 includes a P type shield region 250 disposed under the inner bottom surface of the trench 240. The P type shield region 250 has a structure for protecting the first insulating layer 271 of the trench 240.

The P type shield region 250 covers the inner bottom surface and edges of the trench 240. Herein, the inner edges of the trench 240 indicate edges where the inner bottom surface of the trench 240 meets the inner sides of the trench. The inner edges of the trench 240 are a region where an electric field is most strongly applied, and the P type shield region 250 may cover the inner edges of the trench 240 and thus weaken the electric field at the inner edges of the trench 240.

In addition, the P type shield region 250 covers the inner edges of the trench 240 and may be extended to a partial height of the inner sides of the trench 240. However, the P type shield region 250 is extended to the partial height of the inner sides of the trench 240 but not to the P type region 220.

However, since silicon carbide (SiC) is not well diffused in a horizontal direction during the ion implantation, the P type shield region 250 covering the inner edges of the trench 240 are difficult to form.

Figure 2:
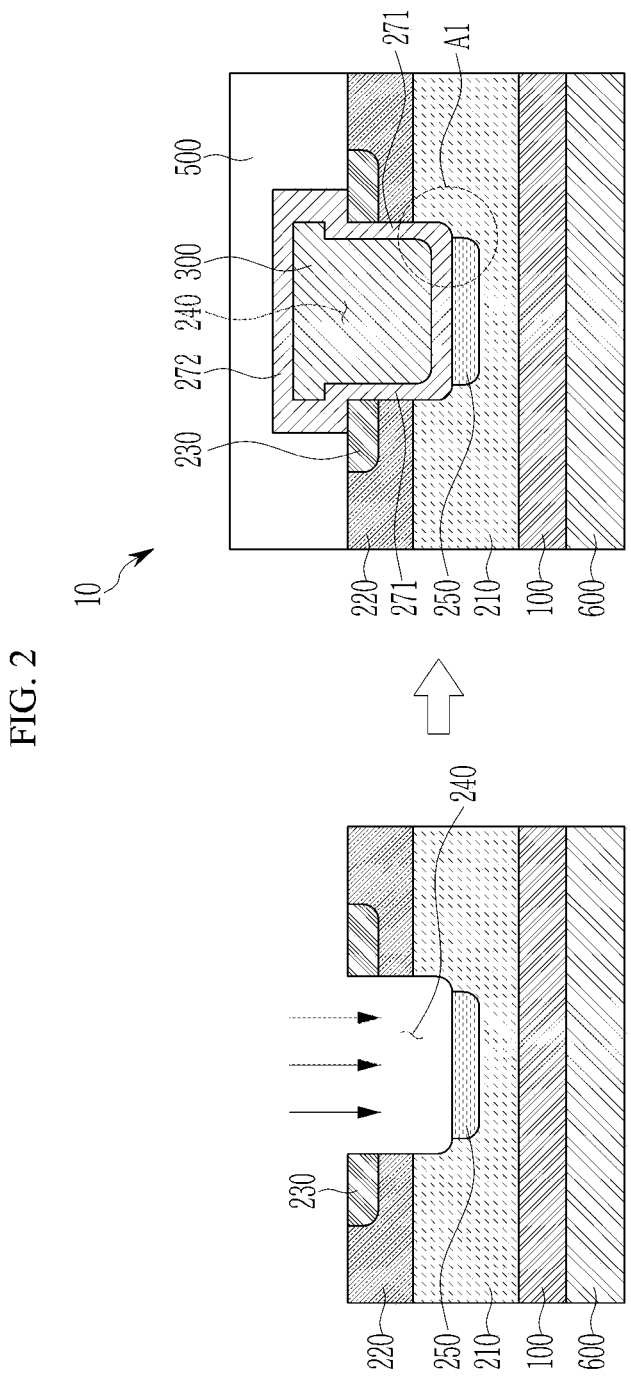
FIG. 2 is a view showing a cross-section of a conventional method for manufacturing a semiconductor device according to an example and a semiconductor device manufactured by the method.
Figure 3:
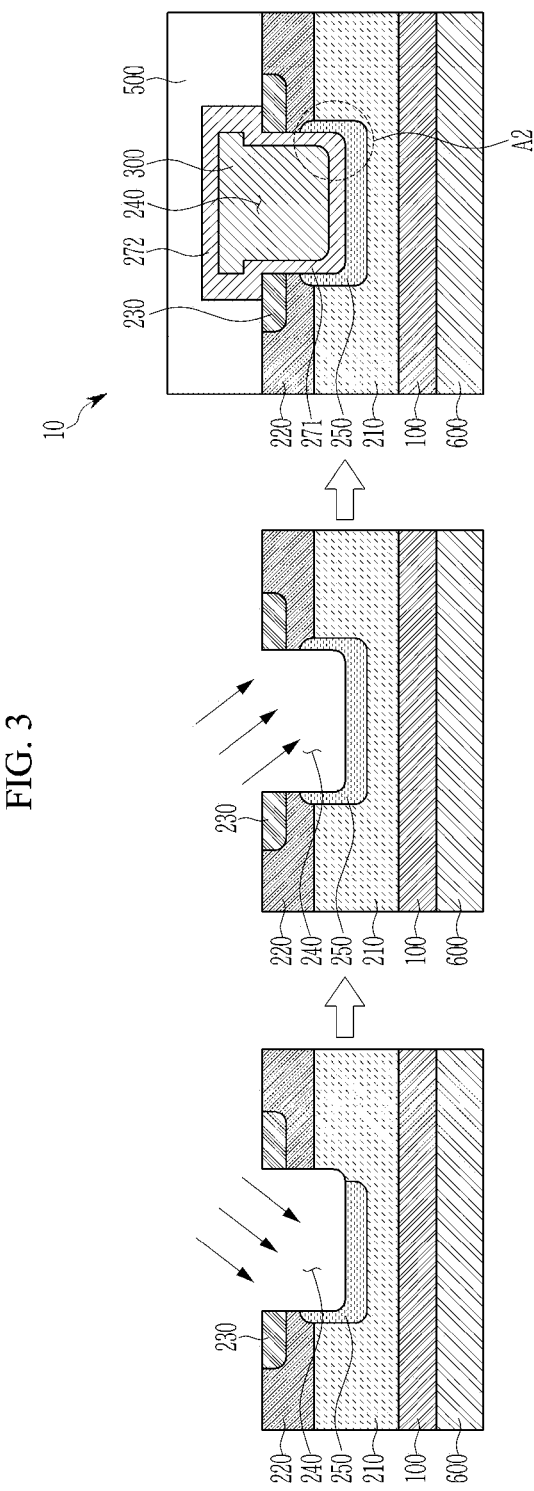
FIG. 3 is a view showing a cross-section of a conventional method for manufacturing a semiconductor device according to another example and a semiconductor device manufactured by the method.

FIGS. 2 and 3 are views showing cross-sections of conventional methods for manufacturing a semiconductor device and semiconductor devices manufactured by the methods.

Referring to FIG. 2, when the P type shield region 250 is formed by implanting ions perpendicularly (tilt 0°) to the bottom surface of the trench 240, since the ions are not well diffused in the horizontal direction during implantation of the ions, the P type shield region 250 may not be formed to cover the edges of the trench 240 (refer to a region A1 of FIG. 2). Accordingly, the edges of the trench 240 are exposed to an epitaxial region of the N-type layer 210 and not protected by the P type shield region 250.

Referring to FIG. 3, when the P type shield region 250 is formed on the bottom surface of the trench 240 through tilt ion implantation, the P type shield region 250 may also be formed in the P type region 220 and have a problem of blocking a current path (channel) (refer to a region A2 of FIG. 3). Herein, although a voltage is applied to the gate electrode 300, the current path is not formed, not conducting a current.

Accordingly, a method of manufacturing the semiconductor device 10 according to another embodiment may solve this problem through a structure of including the P type shield region 250 by using a sacrificial layer 251.

FIGS. 4 to 14 are views sequentially illustrating each step of a method for manufacturing a semiconductor device 10 according to an embodiment. In FIGS. 4 to 14, only the main processes are shown, and the order may be changed depending on process environments and conditions.

Figure 4:
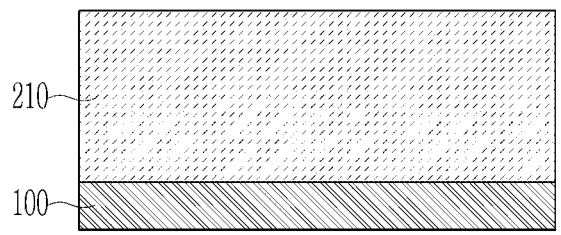
FIG. 4 is a view sequentially illustrating each step of a method for manufacturing a semiconductor device according to an embodiment.

Referring to FIG. 4, the N-type layer 210 is formed on the first surface of the N+ type substrate 100. For example, after preparing the N+ type substrate 100, the N-type layer 210 is formed on the first surface of the N+ type substrate 100 through epitaxial growth.

Figure 5:
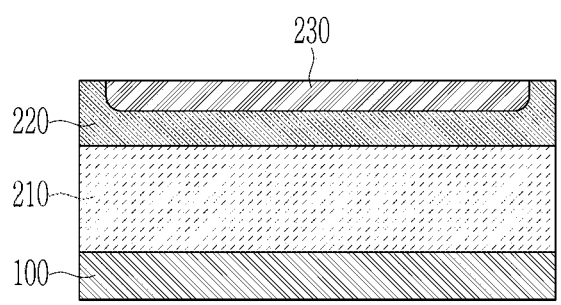
FIG. 5 is a view sequentially illustrating each step of a method for manufacturing a semiconductor device according to an embodiment.

Referring to FIG. 5, on the N-type layer 210, the P type region 220 is formed. For example, the P type region 220 is formed by implanting ions into an upper region of the N-type layer 210. Optionally, the N+ type region 230 may be further formed by implanting ions into a portion of the upper region of the P type region 220. Herein, the P type region 220 and the N+ type region 230 may be formed not by the ion implantation but by the epitaxial growth. Subsequently, the P type region 220 and/or the N-type layer 210 may be etched to form a trench.

Figure 6:
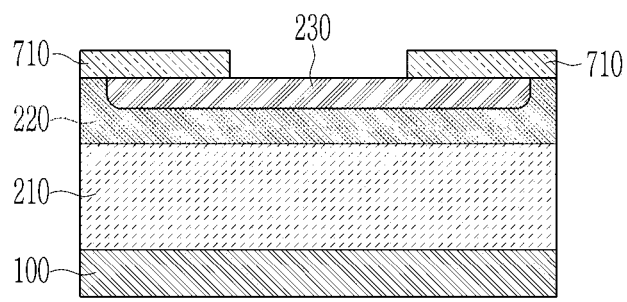
FIG. 6 is a view sequentially illustrating each step of a method for manufacturing a semiconductor device according to an embodiment.

Referring to FIG. 6, on the P type region 220, a first mask 710 having an opening having a first width is formed. Herein, when the N+ type region 230 is further included, the first mask 710 may be formed on the N+ type region 230. The first mask 710 may be, for example, a hardmask including $Si_2N_3$.

Figure 7:
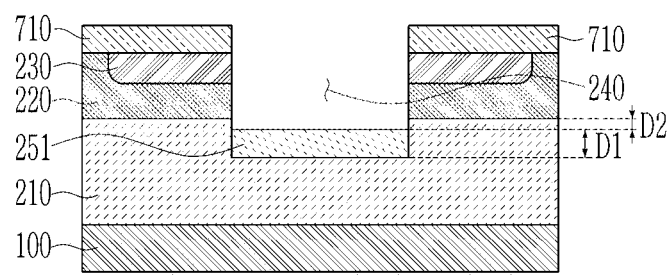
FIG. 7 is a view sequentially illustrating each step of a method for manufacturing a semiconductor device according to an embodiment.

Referring to FIG. 7, the first mask 710 may be used to etch the N-type layer 210 and the P type region 220 to have the first width and thus form the trench 240. A depth (Y direction) of the trench 240, that is, the inner bottom surface of the trench 240 may be disposed inside the N-type layer 210 through the N+ type region 230 and the P type region 220 but not reach the N+ type substrate 100.

Next, the sacrificial layer 251 is formed on the inner bottom surface of the trench 240.

The sacrificial layer 251 may not only be disposed on the inner bottom surface of the trench 240 but also fill inside the trench 240 to a partial height (D1) of the inner side of the trench 240 from the inner bottom surface of the trench 240. For example, the sacrificial layer 251 may include $N_xSi_y$(x, y≥2). For example, the sacrificial layer 251 may have a thickness of about 10 nm or more. Herein, the thickness of the sacrificial layer 251 indicates the Y direction distance (i.e., D1) from the inner bottom surface of the trench 240 to the upper surface of the sacrificial layer 251. The upper surface of the sacrificial layer 251 may be defined as a second surface which is opposite to the first surface of the sacrificial layer 251 that contacts the inner bottom surface of the trench 240.

The upper surface of the sacrificial layer 251 may be disposed under an interface of the P type region 220 and the N-type layer 210. In other words, the sacrificial layer 251 may be disposed only in an inner region of the N-type layer 210 but not contact the P type region 220.

The P type shield region 250 is formed on the inner surface of the trench exposed by removing the sacrificial layer 251, wherein a current path (channel) is formed as high as a height (D2) of the N-type layer 210 between the upper surface of the sacrificial layer 251 and the interface of the P type region 220 and the N-type layer 210.

Accordingly, the height (D1) of the sacrificial layer 251 may be controlled to adjust the distance (D2) between the upper surface of the sacrificial layer 251 and the interface of P type region 220 and the N-type layer 210, thereby adjusting the height of the channel.

Subsequently, a second mask 720 is formed at the inner sides of the trench 240.

Figure 8:
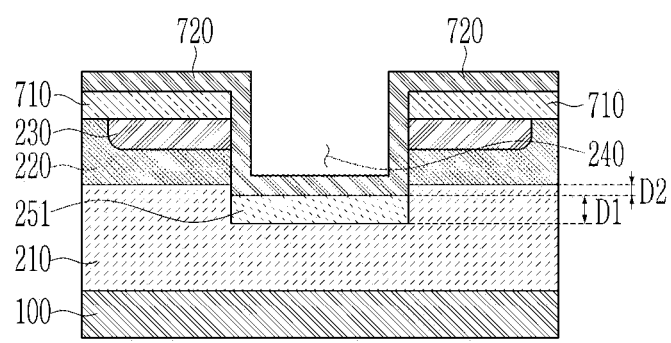
FIG. 8 is a view sequentially illustrating each step of a method for manufacturing a semiconductor device according to an embodiment.

Referring to FIG. 8, the second mask 720 is formed at the inner sides of the trench 240 and on the upper surface of the sacrificial layer 251. Herein, the second mask 720 may be formed on the first mask 710. For example, the second mask 720 may include $SiO_2$.

Figure 9:
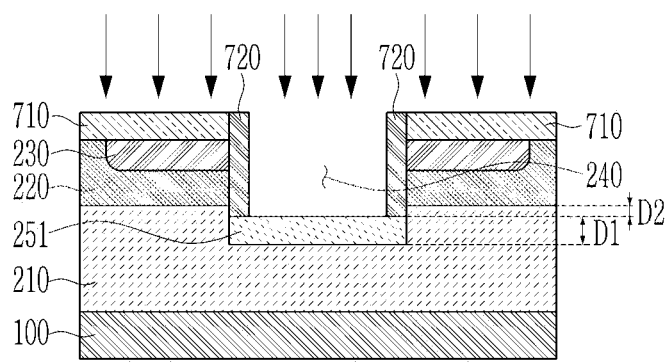
FIG. 9 is a view sequentially illustrating each step of a method for manufacturing a semiconductor device according to an embodiment.

Referring to FIG. 9, when the second mask 720 disposed on the upper surface of the sacrificial layer 251 is removed to expose the sacrificial layer 251, the second mask 720 may be formed only at the inner sides of the trench 240. For example, the second mask 720 disposed on the upper surface of the sacrificial layer 251 may be removed in a dry etching method. Herein, the second mask 720 on the first mask 710 may be removed together.

Subsequently, the sacrificial layer 251 is removed.

Figure 10:
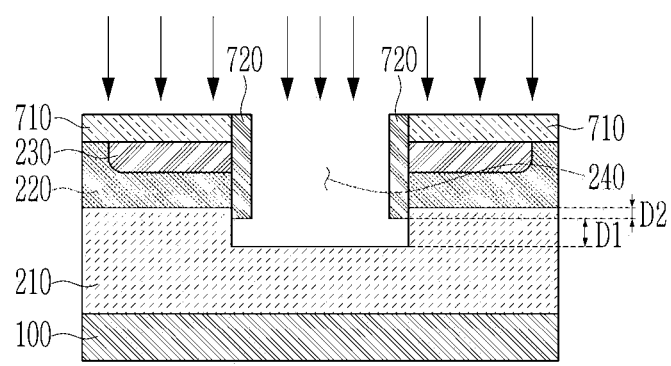
FIG. 10 is a view sequentially illustrating each step of a method for manufacturing a semiconductor device according to an embodiment.

Referring to FIG. 10, in order to remove the sacrificial layer 251 alone, while the second mask 720 at the inner side of the trench 240 is left, a wet etching method having high etch selectivity of the sacrificial layer 251 and the second mask 720 may be used. For example, when the sacrificial layer 251 includes $N_xSi_y$(x, y≥2), and the second mask 720 includes $SiO_2$, the second mask 720 and the sacrificial layer 251 may be etched in an etch-rate ratio of about 1:1.5 or more in the wet etching method including phosphoric acid ($H_3PO_3$).

Subsequently, when the sacrificial layer 251 is removed to reveal the inner sides of the trench, ions are implanted thereinto to form the P type shield region 250.

Figure 11:
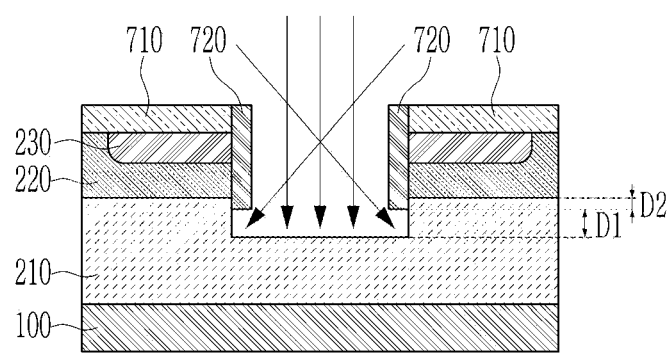
FIG. 11 is a view sequentially illustrating each step of a method for manufacturing a semiconductor device according to an embodiment.

Referring to FIG. 11, a method of implanting the ions into the inner sides of the trench revealed by removing the sacrificial layer 251 may be, for example, tilt ion implantation and vertical ion implantation.

Figure 12:
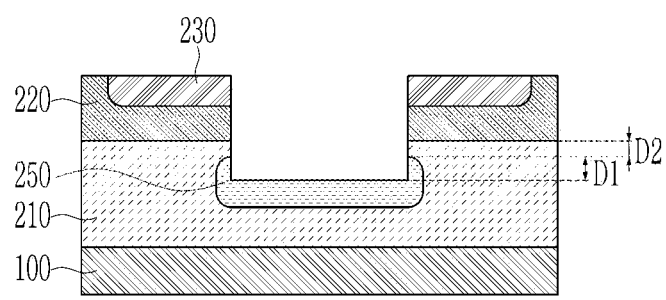
FIG. 12 is a view sequentially illustrating each step of a method for manufacturing a semiconductor device according to an embodiment.

A triple ion implantation method of the tilt ion implantations (left, right) and the vertical ion implantation, as shown in FIG. 12, may be used to form the P type shield region 250 to cover the inner bottom surface and edges of the trench 240. The inner edges of the trench 240 are a region to which an electric field is most strongly applied, and the P type shield region 250 may cover the inner edges of the trench 240 and thus weaken the electric field thereof.

Herein, since a portion of the inner sides of the trench 240 is protected by the second mask 720 which blocks the ions from being implanted thereinto, the P type shield region 250 may extend to a partial height of the inner sides of the trench 240 but not to the P type region 220. Accordingly, as shown in FIG. 3, the problem that the P type shield region 250 blocks the current path (channel) may be prevented (refer to the region A2 of FIG. 3).

Subsequently, after removing the first mask 710 and the second mask 720, the first insulating layer 271 is formed inside the trench 240.

In addition, the gate electrode 300 is formed inside the trench 240 where the first insulating layer 271 is formed. Herein, a first gate electrode region is formed by filling the trench 240, and a second gate electrode region is further formed to be protruded outside the trench 240.

Subsequently, on the second gate electrode region protruded outside the trench 240, the second insulating layer 272 is formed, and the source electrode 500 is formed on the N+ type region 230 and/or the N-type epitaxial layer on the P type region 220. The source electrode 500 is insulated from the gate electrode 300 by the second insulating layer 272.

Lastly, the drain electrode 600 is formed on the second surface of the N+ type substrate 100, manufacturing the semiconductor device 10 shown in FIG. 1.

Hereinafter, specific examples are presented. However, the examples described below are only for illustration or explanation, and the scope of the disclosure is not limited thereto.

The semiconductor device of Example 1, as shown in FIG. 1, includes a P type shield region covering the bottom surface and edges of the trench.

A semiconductor device of Comparative Example 1, as shown in FIG. 2, includes the P type shield region in the bottom surface of the trench, but the P type shield region does not cover edges of the bottom surface of the trench.

Figure 13:
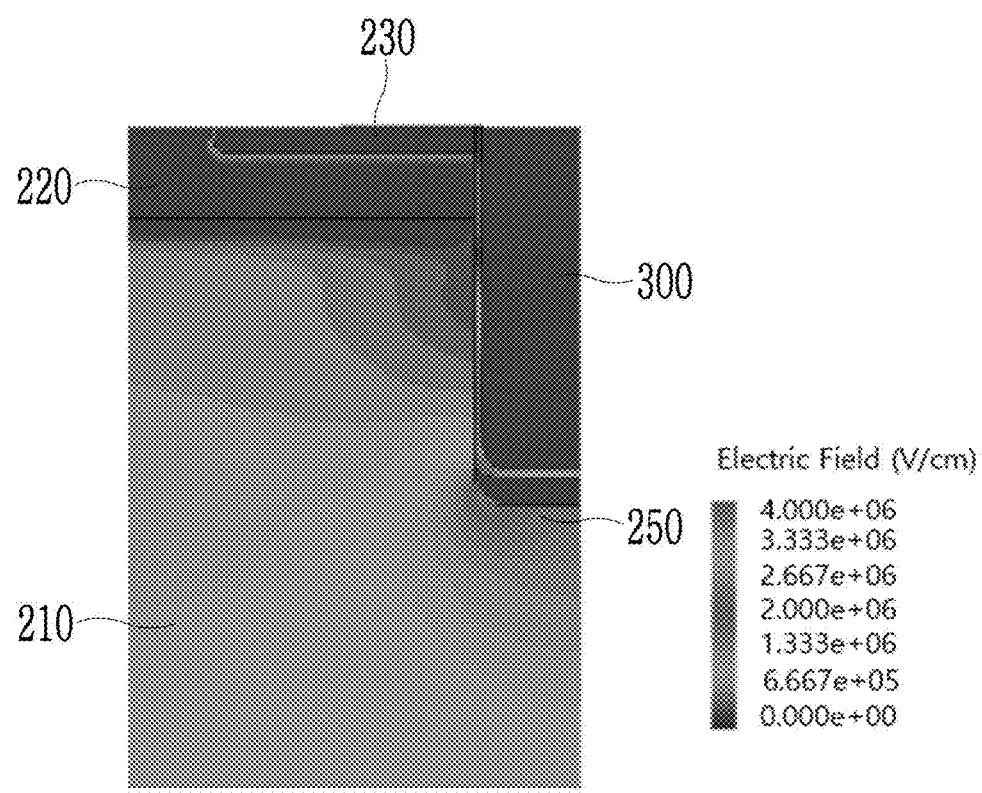
FIG. 13 is a view showing an electric field distribution of the semiconductor device manufactured in Example 1.
Figure 14:
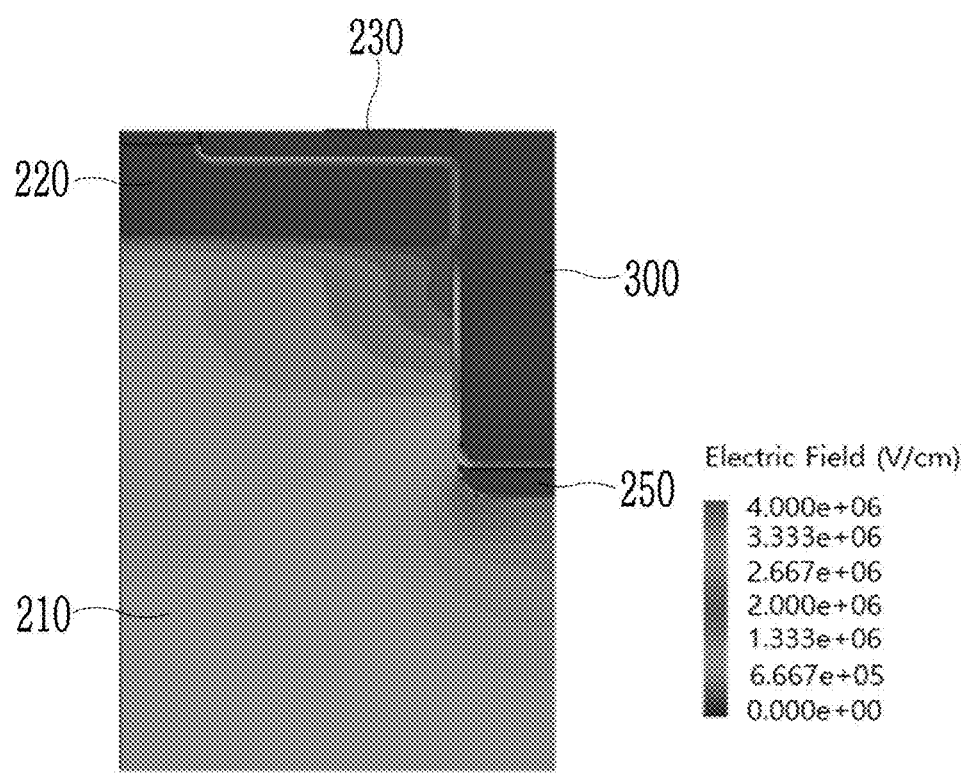
FIG. 14 is a view illustrating an electric field distribution of a semiconductor device manufactured in Comparative Example 1.

FIG. 13 is a view showing an electric field distribution of the semiconductor device manufactured in Example 1, and FIG. 14 is a view illustrating an electric field distribution of a semiconductor device manufactured in Comparative Example 1. The electric field distribution is obtained by Sentaurus TCAD made by Synopsys, Inc.

Figure 15:
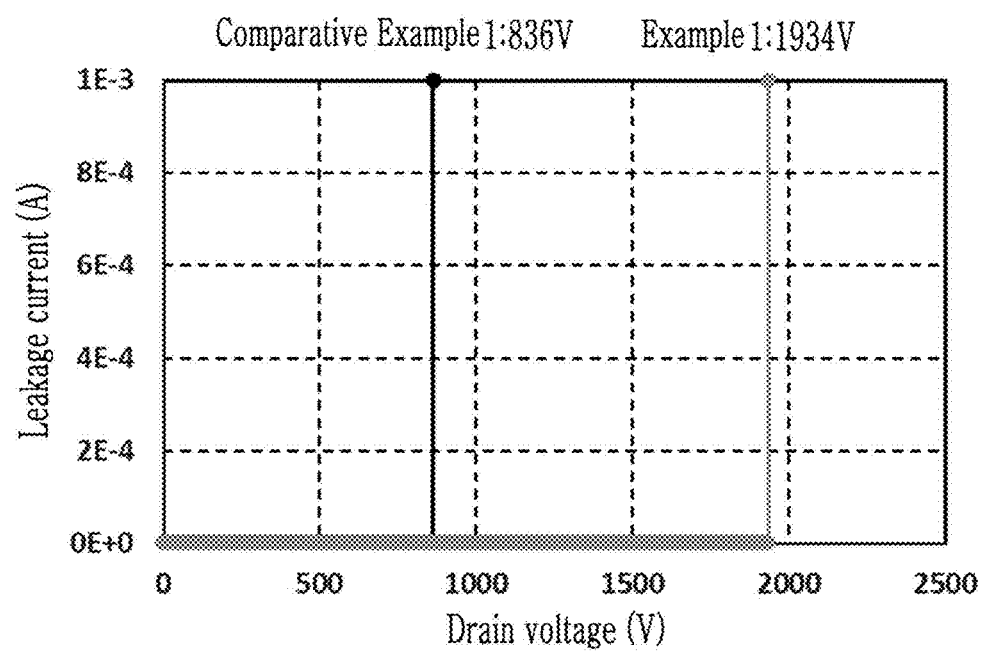
FIG. 15 is a graph showing breakdown voltages of semiconductor devices manufactured in Comparative Example 1 and Example 1.

FIG. 15 is a graph showing breakdown voltages of semiconductor devices manufactured in Comparative Example 1 and Example 1. In addition, the results of FIG. 15 are summarized in Table 1.

TABLE 1

|  | Example 1 | Comparative Example 1 |
| --- | --- | --- |
| Breakdown voltage [V] | 1934 | 836 |

Referring to FIGS. 13 to 15 and Table 1, the semiconductor device of Example 1 exhibits a high breakdown voltage, compared with the semiconductor device of Comparative Example 1. Accordingly, the semiconductor device of Example 1 may protect an oxide film of the edge portion of the trench gate and particularly, prevent concentration of an electric field on an oxide film in the SiC-based semiconductor device and thus destruction of the oxide film of the edge portion of the trench gate and reduction of a breakdown voltage.

While this disclosure has been described in connection with what is presently considered to be practical example embodiments, it is to be understood that the disclosure is not limited to the disclosed embodiments. On the contrary, it is intended to cover various modifications and equivalent arrangements included within the spirit and scope of the appended claims.

What is claimed is:

1. A method for manufacturing a semiconductor device, comprising:
    forming an N-type layer on a first surface of an N+ type substrate,
    forming a P type region in the N-type layer,
    etching the P type region and the N-type layer to form a trench,
    forming a sacrificial layer on an inner bottom surface of the trench,
    forming a first mask on an inner side of the trench,
    removing the sacrificial layer, and
    implanting ions into an inner surface of the trench exposed by the removal of the sacrificial layer to form a P type shield region,
    wherein an upper surface of the sacrificial layer is disposed under an interface between the P type region and the N-type layer, and
    wherein a height of a channel is adjusted by adjusting a distance between the upper surface of the sacrificial layer and the interface between the P type region and the N-type layer.

2. The method of claim 1, wherein
the forming of the trench comprises:
    forming a second mask having an opening having a first width on the N-type layer, and then etching the N-type layer to a partial depth using the second mask to form the trench.

3. The method of claim 2, wherein
the method further comprises forming a source electrode on the N-type layer to be insulated from the gate electrode.

4. The method of claim 1, wherein
the sacrificial layer fills an interior of the trench from the inner bottom surface of the trench to a partial height of the inner side of the trench.

5. The method of claim 4, wherein
the sacrificial layer has a height of greater than or equal to about 10 nm.

6. The method of claim 1, wherein
the forming of the first mask comprises
forming the first mask on the inner side of the trench and the upper surface of the sacrificial layer, and
removing the first mask on the upper surface of the sacrificial layer to expose the sacrificial layer.

7. The method of claim 6, wherein
the removing of the first mask on the upper surface of the sacrificial layer uses a dry etching method.

8. The method of claim 6, wherein
the removing of the sacrificial layer uses a wet etching method including phosphoric acid ($H_3PO_3$).

9. The method of claim 8, wherein
an etch-rate ratio of the first mask and the sacrificial layer is greater than or equal to about 1:1.5.

10. The method of claim 9, wherein
the sacrificial layer comprises $N_xSi_y$(x, y≥2), and
the first mask comprises $SiO_2$.

11. The method of claim 1, wherein
the forming of the P type shield region uses a tilt ion implantation and a vertical ion implantation method.

12. The method of claim 1, wherein
the method further comprises forming a first insulating layer on the inner bottom surface and side surface of the trench and on the P type region.

13. The method of claim 1, wherein
the method further comprises forming a second insulating layer on a gate electrode after forming the gate electrode inside the trench.

14. The method of claim 1, wherein
the method further comprises forming an N+ type region in the P type region and on a side surface of the trench.

15. The method of claim 1, wherein
the method further comprises forming a drain electrode on a second surface of the substrate.

* * * * *